United States Patent
Takahashi et al.

(10) Patent No.: US 9,349,944 B2
(45) Date of Patent: May 24, 2016

(54) MAGNETIC TUNNEL JUNCTION DEVICE

(71) Applicant: Samsung Electronics Co., Ltd., Suwon-si (KR)

(72) Inventors: Shigeki Takahashi, Yokohama (JP); Yoshiaki Sonobe, Yokohama (JP); Koki Takanashi, Miyagi (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/578,671

(22) Filed: Dec. 22, 2014

(65) Prior Publication Data

US 2015/0188034 A1    Jul. 2, 2015

(30) Foreign Application Priority Data

Dec. 27, 2013  (JP) ................................ 2013-272159

(51) Int. Cl.
*H01L 43/10* (2006.01)
*H01L 43/02* (2006.01)
*H01L 43/08* (2006.01)
*H01L 43/12* (2006.01)

(52) U.S. Cl.
CPC ................ *H01L 43/08* (2013.01); *H01L 43/02* (2013.01); *H01L 43/10* (2013.01); *H01L 43/12* (2013.01)

(58) Field of Classification Search
CPC ......... H01L 43/02; H01L 43/08; H01L 43/10; H01L 43/12
USPC .................. 257/295, 414, 421, 425, E29.323, 257/E43.004, E43.005; 365/158, 171; 438/2, 3, 382; 977/933, 935
See application file for complete search history.

(56) References Cited

U.S. PATENT DOCUMENTS

| | | | |
|---|---|---|---|
| 5,491,757 A | 2/1996 | Lehmer et al. | |
| 7,881,024 B2 | 2/2011 | Ide et al. | |
| 8,680,632 B2 | 3/2014 | Daibou et al. | |
| 2012/0088125 A1 | 4/2012 | Nishiyama et al. | |
| 2012/0241881 A1* | 9/2012 | Daibou | H01L 43/10 257/421 |
| 2014/0084401 A1* | 3/2014 | Kato | H01L 43/10 257/425 |
| 2014/0264663 A1* | 9/2014 | Chen | H01L 43/08 257/421 |
| 2015/0162378 A1* | 6/2015 | Carey | H01L 43/02 257/421 |

FOREIGN PATENT DOCUMENTS

| | | |
|---|---|---|
| JP | 2007-189039 | 7/2007 |
| JP | 2010-232499 | 10/2010 |
| JP | 2012-204683 | 10/2012 |
| JP | 2013-168455 | 8/2013 |

* cited by examiner

*Primary Examiner* — Dao H Nguyen
(74) *Attorney, Agent, or Firm* — Myers Bigel & Sibley, P.A.

(57) ABSTRACT

A magnetic tunnel junction device includes: a first magnetic layer that has an easy axis vertical to a surface; a non-magnetic layer on the first magnetic layer; and a second magnetic layer that has an easy axis vertical to a surface on the non-magnetic layer, and an interface layer formed of a Heussler alloy between the non-magnetic layer and at least one of the first and second magnetic layers. The at least one of the first and second magnetic layers is formed of MnGa. A lattice constant of the interface layer parallel to a major surface thereof in a bulk state thereof is between a lattice constant of the non-magnetic layer parallel to a major surface thereof in a bulk state thereof and a lattice constant of the at least one of the first and second magnetic layers parallel to a major surface thereof in a bulk state thereof.

20 Claims, 3 Drawing Sheets

MAGNETIC TUNNEL JUNCTION DEVICE

CROSS-REFERENCE TO RELATED APPLICATION

This application claims priority under 35 U.S.C. §119 to Japanese Patent Application No. 2013-272159, filed Dec. 27, 2013 in the Japanese Patent Office, the entire content of which is incorporated by reference herein.

BACKGROUND

The inventive concepts described herein relate to magnetic tunnel junction devices and, more particularly, to magnetic tunnel junction devices that are used in magnetic random access memory (MRAM) devices.

Recently, MRAMs that use the magnetic resistance effects of ferromagnetic materials to store data have been identified for potential use as next-generation solid-state nonvolatile memories because of their potential to support fast read and write times while providing large storage capacity and low operating power requirements. Magnetic tunnel junction (MTJ) devices that have ferromagnetic tunnel junctions are of particular interest because of the large variation in magnetic resistance exhibited by such devices.

A ferromagnetic tunnel junction may comprise a stack of at least three layers that includes a storage layer, an insulation layer and a fixed layer that maintains a specific magnetization orientation. When a current is introduced into the ferromagnetic tunnel junction device, the current may tunnel through the insulation layer. When this tunneling occurs, a resistance of the junction is changed according to a relative angle of the magnetization orientations of the storage layer and the fixed layer. If the magnetization orientations of the fixed layer and the storage layer are parallel, the junction resistance is minimized. But if the magnetization orientations are anti-parallel, the junction resistance is maximized. Such resistive change is referred to as a tunneling magneto-resistance effect (TMR). By using a magnetoresistive device that has such a ferromagnetic tunnel junction as a memory cell, the memory cell is capable of holding information in which the binary codes '0' or '1' correspond to the parallel and anti-parallel states of the storage layer and the fixed layer.

To program or "write" data into a magnetic tunnel junction device, a spin transfer writing mechanism that uses spin angular momentum migration may be used. With this mechanism, a spin polarization current may be allowed to flow into the MTJ device, and this current forces a magnetization orientation of the storage layer to be reversed. MRAM devices that include MTJs may exhibit high integration density and low power consumption, and may easily induce magnetization inversions of magnetic materials.

The use of magnesium oxide (MgO) as an insulation layer of an MTJ device has theoretically been proposed as a means for obtaining a high magnetic resistance ratio (i.e., the ratio of the minimum and maximum junction resistances). By crystallizing MgO, electrons with a specific wave number may be selectively tunneled into a ferromagnetic layer. During this tunneling, a spin polarization rate is larger for a specific crystallization orientation, resulting in a high magnetic resistance ratio. In an MTJ device, a larger magnetic resistance ratio may correspond to higher integration density and lower power consumption.

A spin transfer type (STT) MRAM is known in the art that uses a manganese-gallium (MnGa) of $L1_0$ structure for a ferromagnetic layer (the MnGa layer may be used as the storage layer or the fixed layer), as disclosed in Japanese Patent Publication No. 2012-204683. However, since MgO and MnGa are not harmonized with each other in crystal lattice architecture, the lattice mismatch can degrade the magnetic characteristics of such a device.

Japanese Patent Publication No. 2012-204683 proposes a solution for the lack of lattice harmonization between MnGa and MgO, as follows. That solution is to adopt MgAlO for the non-magnetic tunnel barrier layer and MnAl as an interface layer of the tunnel barrier layer.

SUMMARY

In an embodiment, a magnetic tunnel junction device may include: a first magnetic layer that has an easy axis that is vertical to a major surface of the first magnetic layer; a non-magnetic layer on the first magnetic layer; a second magnetic layer that has an easy axis that is vertical to a major surface of the second magnetic layer on the non-magnetic layer; and an interface layer formed of a Heussler alloy between the non-magnetic layer and at least one of the first and second magnetic layers. The at least one of the first and second magnetic layers is formed of MnGa. A lattice constant of the interface layer parallel to a major surface of the interface layer in a bulk state thereof may be between a lattice constant of the non-magnetic layer parallel to a major surface of the non-magnetic layer in a bulk state thereof and a lattice constant of the at least one of the first and second magnetic layers parallel to a major surface thereof in a bulk state thereof. A current flowing through the first magnetic layer, the non-magnetic layer, the second magnetic layer and the interface layer may change magnetization orientation of one of the first and second magnetic layers.

In another embodiment, a magnetic tunnel junction device may include a first MnGa magnetic layer that has an easy axis that is vertical to a major surface of the first MnGa magnetic layer; a non-magnetic layer on the first MnGa magnetic layer; a second magnetic layer that has an easy axis that is vertical to a major surface of the second magnetic layer on the non-magnetic layer; and an interface layer formed of a Heussler alloy between the first MnGa magnetic layer and the non-magnetic layer. The interface layer has a lattice constant parallel to a major surface of the interface layer in a bulk state thereof that is between a lattice constant of the non-magnetic layer parallel to a major surface of the non-magnetic layer in a bulk state thereof and a lattice constant of the first MnGa magnetic layer parallel to the major surface of the first MnGa magnetic layer in a bulk state thereof. The first MnGa magnetic layer, the non-magnetic layer, the second magnetic layer, and the interface layer are configured so that a current flowing through the first MnGa magnetic layer, the non-magnetic layer, the second magnetic layer, and the interface layer changes magnetization orientations of the interface layer and at least one of the first MnGa magnetic layer and the second magnetic layer.

In still another embodiment, a magnetic tunnel junction device may include a first MnGa magnetic layer that has an easy axis that is vertical to a major surface of the first MnGa magnetic layer; a non-magnetic layer comprising MgO on the first MnGa magnetic layer; a second magnetic layer that has an easy axis that is vertical to a major surface of the second magnetic layer on the non-magnetic layer opposite the first MnGa magnetic layer; and an interface layer formed of a Heussler alloy between the first MnGa magnetic layer and the non-magnetic layer. The interface layer has a lattice constant parallel to a major surface of the interface layer in a bulk state thereof that is between a lattice constant of the non-magnetic layer parallel to a major surface of the non-magnetic layer in a bulk state thereof and a lattice constant of the first MnGa magnetic layer parallel to the major surface of the first MnGa magnetic layer in a bulk state thereof.

DETAILED DESCRIPTION

Figure 1:
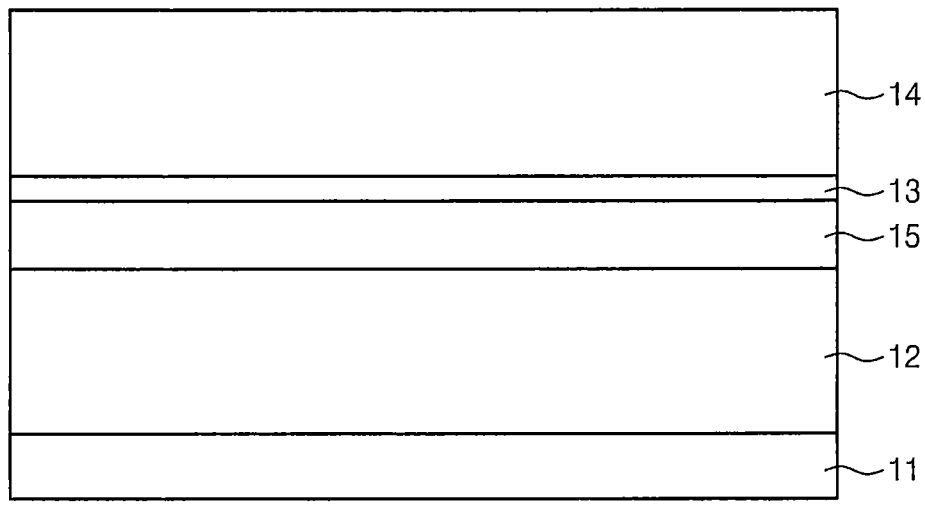
FIG. 1 is a sectional diagram illustrating a magnetic tunnel junction device according to an embodiment of the inventive concepts.

Embodiments of the inventive concepts are described in detail below with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concepts to those skilled in the art. Accordingly, known processes, elements, and techniques may not be described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, operations, elements, and/or components, but do not preclude the presence or addition of one or more other features, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent" another element or layer, it can be directly on, connected, coupled, or adjacent the other element or layer, or intervening elements or layers may be present. In contrast, when an element is referred to as being "directly on," "directly connected to", "directly coupled to", or "immediately adjacent" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The tunnel barrier layer of MgAlO that is suggested in Japanese Patent Publication No. 2012-204683 may reduce the lattice inharmonization with MnGa. However, because of the polycrystalline structure of MgAlO, it may be difficult to form a stable tunnel junction. The use of an MnAl interface layer between an MgO tunnel barrier layer and an MnGa ferromagnetic layer may also reduce lattice inharmonization between the MnGa ferromagnetic layer and an MgO tunnel barrier layer. However in this case a large variation in magnetic characteristics may occur due to the compositional difference between the layers.

Regarding the aforementioned problems, one aspect of embodiments of the inventive concepts provides magnetic tunnel junction devices that are capable of reducing distortion in MnGa lattice structure which may reduce degradation of the device's characteristics.

A magnetic tunnel junction device according to embodiments of the inventive concepts may include a first magnetic layer that has an easy axis that is vertical to a major surface of the first magnetic layer, a non-magnetic layer on the first magnetic layer, a second magnetic layer that has an easy axis that is vertical to a major surface of the second magnetic layer on the non-magnetic layer, and an interface layer formed of a Heussler alloy between the non-magnetic layer and at least one of the first and second magnetic layers. The at least one of the first and second magnetic layers is formed of a MnGa alloy in an $L1_0$ or $D0_{22}$ structure. A current flowing through the first magnetic layer, the non-magnetic layer, the second magnetic layer and the interface layer may change magnetization orientations of the interface layer and one of the first and second magnetic layers. A lattice constant of the interface layer in a direction parallel to a major surface of the interface layer in a bulk state thereof is between a lattice constant of the non-magnetic layer in a direction parallel to a major surface of the non-magnetic layer in a bulk state thereof and a lattice constant of the at least one of the first and second magnetic layers in a direction parallel to a major surface thereof in a bulk state thereof.

Now hereinafter will be described exemplary embodiments of the inventive concepts in conjunction with the accompanying drawings. FIG. 1 is a sectional diagram illustrating a magnetic tunnel junction device 10 according to an embodiment of the inventive concepts. The magnetic tunnel junction device 10 according to this embodiment may include a buffer layer 11, a first magnetic layer 12 that has an easy axis that is vertical to a major surface thereof on the buffer layer 11, an interface layer 15 on the first magnetic layer 12, a non-magnetic layer 13 on the interface layer 15, and a second magnetic layer 14 that has an easy axis that is vertical to a major surface thereof on the non-magnetic layer 13. In the embodiment shown in FIG. 1, the first magnetic layer is made of MnGa, and the interface layer 15 is formed of a Heussler alloy that has a lattice constant between those of the first magnetic layer 12 and the non-magnetic layer 13. The second magnetic layer 14 is formed of a material that is different from the non-magnetic layer 13 in lattice constant.

Figure 2:
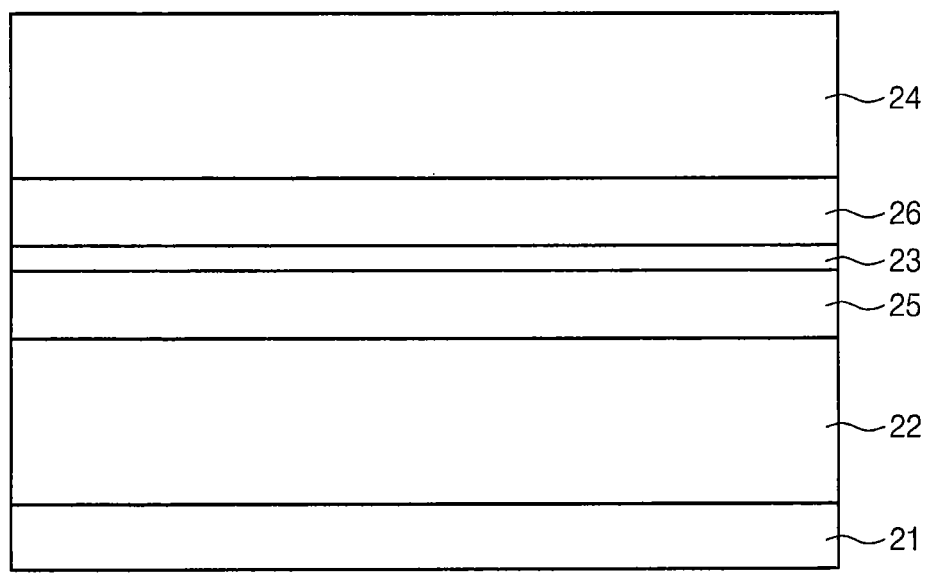
FIG. 2 is a sectional diagram illustrating a magnetic tunnel junction device according to another embodiment of the inventive concepts.

FIG. 2 is a sectional diagram illustrating a magnetic tunnel junction device 20 according to another embodiment of the inventive concepts. The magnetic tunnel junction device 20 according to this embodiment may include a buffer layer 21, a first magnetic layer 22 that has an easy axis that is vertical to a major surface thereof on the buffer layer 21, an interface layer 25 on the first magnetic layer 22, a non-magnetic layer 23 on the interface layer 25, an interface layer 26 on the non-magnetic layer 23, and a second magnetic layer 24 that has an easy axis that is vertical to a major surface thereof on the interface layer 26. In the embodiment shown in FIG. 2, the first magnetic layer 22 and the second magnetic layer 24 are made of MnGa. The non-magnetic layer 23 is interposed between the interface layers 25 and 26 which are formed of a Heussler alloy. The interface layers 25 and 26 have lattice constants which are between those of the first magnetic layer 22 and the non-magnetic layer 23, and between those of the non-magnetic layer 23 and the second magnetic layer 24, respectively.

Hereinafter will be described in detail the components according to certain embodiments of the inventive concepts.

<Buffer Layer>

A magnetic tunnel junction (MTJ) device according to embodiments of the inventive concepts may include a buffer layer that is on a substrate. The buffer layer may be used for controlling crystalline properties such as crystallographic orientation and particle size of the first magnetic layer. Any suitable material may be used to form the buffer layer. The buffer layer may be structured, for example, in tetragonal or cubic crystals oriented toward the (001) crystallographic direction, including at least one element selected from Al, Cr, Fe, Co, Rh, Pd, Ag, Ir, Pt, and Au. In some embodiments, Cr or Pd may be selected in view of lattice harmonization with the layer of MnGa. In some embodiments, a composite buffer layer such as a Cr/Pd layer may be used.

In other embodiments, the buffer layer may be formed of a material with a NaCl structure that is oriented toward the (001) crystallographic direction. A material with such a structure may include an oxide that includes at least one of Mg, Al, and Ce, or may include a nitride that includes at least one of Ti, Zr, Nb, V, Hf, Ta, Mo, W, B, Al, and Ce.

The buffer layer may include a perovskite-type conductive oxide that is composed in the form of $ABO_3$ and is oriented toward the (002) crystallographic direction. In the formula $ABO_3$, the 'A' may include at least one element selected from Sr, Ce, Dy, la, K, Ca, Na, Pb, and Ba, and the 'B' may include at least one element selected from Ti, V, Cr, Mn, Fe, Co, Ni, Ga, Nb, Mo, Ru, Ir, Ta, Ce, and Pb.

If the buffer layer is too thick, the smoothness of the upper surface thereof may be degraded, while if the buffer layer is too thin, it may not sufficiently harmonize the lattice constants. In some embodiments, the buffer layer may have a thickness in the range of 10 to 60 nm. In some embodiments, the buffer layer may have a thickness in the range of 30 to 50 nm.

Although not restrictive, considering the lattice harmonization with MnGa, the substrate may be made of MgO that is oriented toward the (001) crystallographic direction. It will be appreciated, however, that another type of substrate may be used such as, for example, Si, corresponding to an appropriate selection for the buffer layer, to form a stack of MnGa/interface layer/MgO that is characterized in high crystallographic orientation.

<First Magnetic Layer>

A magnetic tunnel junction (MTJ) device may include a first magnetic layer that has an easy axis that is vertical to the film surface. At least one of the first magnetic layer and a second magnetic layer, which will be described later, may be formed of MnGa. In the MTJ device one of the first and second magnetic layers is used as a fixed layer and the other is used as a storage layer. Either or both the first magnetic layer or the second magnetic layer may be made of MnGa.

Hereinafter various embodiments will be described in which the first magnetic layer is made of MnGa. An MnGa alloy has a high spin polarization rate that may result in a large magnetic resistance ratio. Additionally, MnGa has a small damping constant and has low energy requirements for magnetization inversion. As such, reduced current density is required for magnetization inversion in MnGa. Because of these physical properties, an MnGa alloy is a potential material for a ferromagnetic layer of MRAM devices. The MnGa alloy is a ferromagnetic substance when a composition ratio of Mn is at an atomic percentage (at %) of 50. In various embodiments of the inventive concepts, the composition ratio for $Mn_xGa_{100-x}$ may be $43 \leq x \leq 75$ at %. In other embodiments, the composition ratio for $Mn_xGa_{100-x}$ may be $43 \leq x \leq 64$ at %. It is possible to adjust the composition ratio of Mn to control rates of saturation magnetization and magnetocrystalline anisotropy.

In embodiments of the inventive concepts, the MnGa alloy may be configured in an $L1_0$ or a $D0_{22}$ structure. The MnGa alloy having a $L1_0$ or $D0_{22}$ structure is theoretically estimated to have high vertical magnetoanisotropy (Ku) of over 20 Merg/cm$^3$, an adjustable saturation magnetization (Ms) about 800 emu/cm$^3$, a high spin polarization rate (P) of 71%, and a very low damping constant ($\alpha$) of 0.0003, and to otherwise have properties that are suitable for an MTJ device that is employed in a highly integrated STT-MRAM. The range of composition ratios for the $L1_0$ structure may be $43 \leq x \leq 64$ at % in some embodiments, while the range of composition ratios for the $D0_{22}$ structure may be $67 \leq x \leq 75$ at % in some embodiments.

In MnGa having an $L1_0$ or $D0_{22}$ structure, a lattice constant c for the (001) crystallographic orientation is different from a lattice constant a for the (100) and (010) crystallographic orientations. Accordingly, in an MnGa alloy having a $L1_0$ or $D0_{22}$ structure, the c-axis acts as an easy axis. By growing the MnGa so that the c-axis extends in a direction vertical to the surface of the underlying film, the easy axis of the first magnetic layer can be vertical to the major surface thereof. Additionally, such an MnGa structure may be a stable ferromagnetic alloy. Oriented crystalline growth may be, for example, controlled by properly selecting the material and crystallographic orientation of the buffer layer.

Because of the low current density requirements for magnetization inversion, the MnGa alloy is suitable for a storage layer of the MTJ device. However, it will be appreciated that the MnGa alloy may also be used as a fixed layer of the MTJ device in accordance with a material composition of the second magnetic layer.

The thickness of the first magnetic layer of MnGa may be selected based on a number of factors including whether the MnGa layer is acting as a fixed layer or a storage layer. In some embodiments, the thickness of the MnGa layer may be about 5~10 mm. When the first magnetic layer is used as the fixed layer, the MnGa layer may be thicker, such as, for example, about 5~25 nm, or in the tighter range of 6~10 nm. When the first magnetic layer is used as the storage layer, the MnGa layer may be thinner, such as, for example, about 1~15 nm, or in the tighter range of 2~7 nm.

<Interface Layer>

A magnetic tunnel junction (MTJ) device according to embodiments of the inventive concepts may include an interface layer formed of a Heussler alloy. This interface layer may be between the non-magnetic layer and at least one of the first and second magnetic layers.

Magnesium oxide (MgO) may be used to form the non-magnetic layer. MgO has a lattice constant that is very different from the lattice constant for MnGa. If there is lattice inharmonization between the non-magnetic layer and the first or second magnetic layer, the MnGa may not grow according to its own lattice constant and instead there may be a lattice distortion. Such lattice distortion may change the magnetic characteristics of the MnGa, and hence the resulting MTJ device may not have the desired magnetic characteristics. Moreover, when lattice distortion is present, defects may be generated in the material layers, such as at the interface between the two layers, in order to decrease the interface energy. When a current flows through the MTJ device, such defects may scatter electrons, which may reduce the magnetic resistance ratio. As a result, the MTJ device may exhibit variability in its magnetic characteristics, which may be undesirable.

Figure 3:
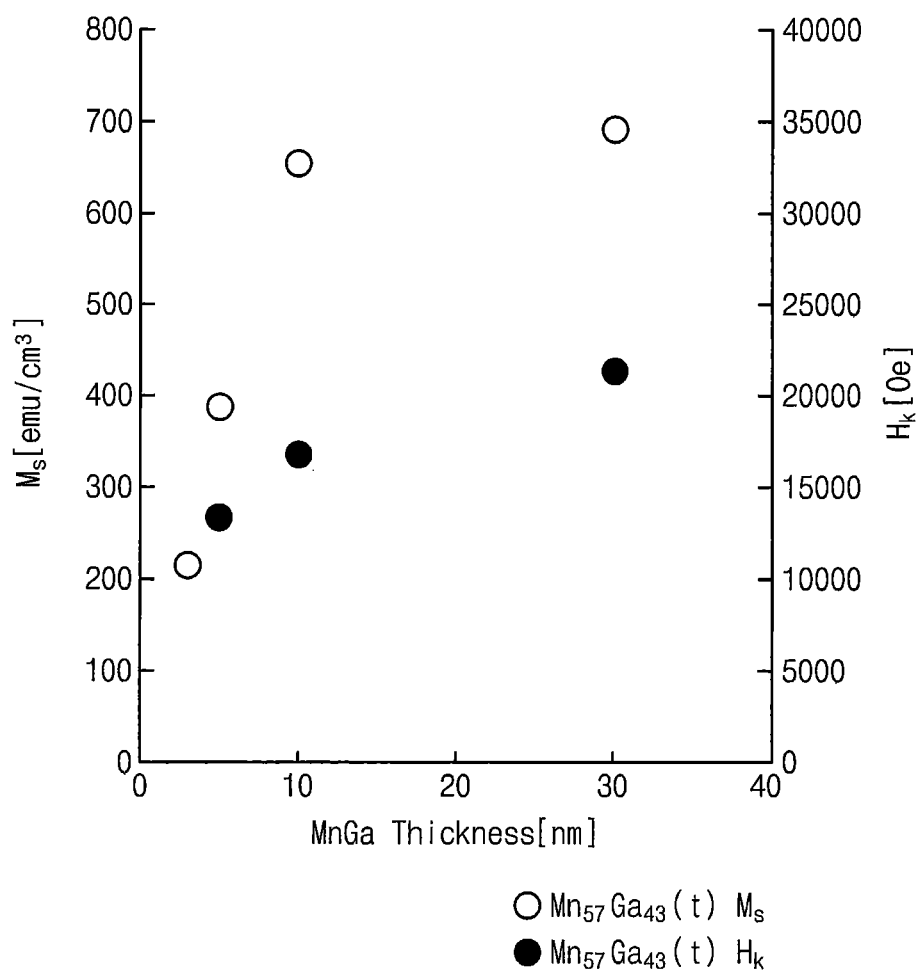
FIG. 3 is a graph plotting correlations between anisotropic magnetic field HK and thickness of $Mn_{57}Ga_{43}$ and correlations between saturation magnetization Ms and thickness of $Mn_{57}Ga_{43}$.
Figure 4:
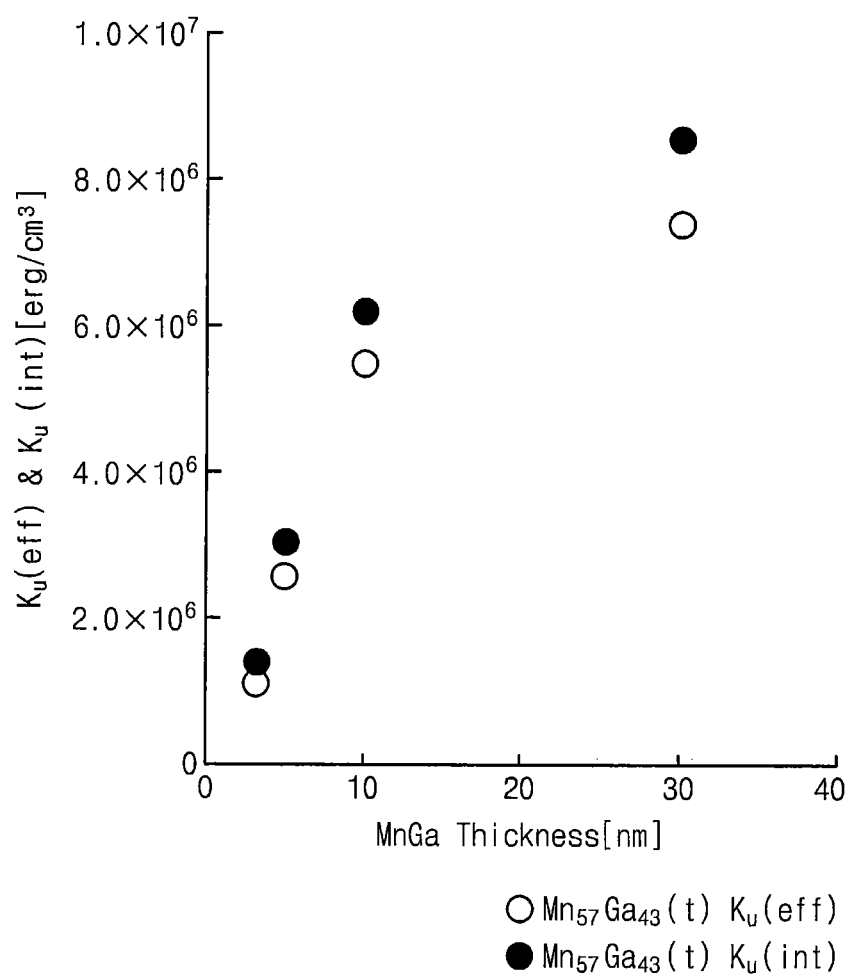
FIG. 4 is a graph plotting correlations between inherent vertical magnetic anisotropy Ku(int) and thickness of $Mn_{57}Ga_{43}$, and effective vertical magnetic anisotropy Ku(eff) and thickness of $Mn_{57}Ga_{43}$.

As stated above, an MnGa layer having an $L1_0$ structure may exhibit a number of properties that are suitable for an MTJ device. However, the magnetic characteristics of MnGa may deteriorate heavily because of compositional variation and/or lattice distortion. FIGS. 3 and 4 exemplarily show the dependency of the magnetic characteristics of the MnGa, which is formed on a Cr buffer layer of 40 nm that is deposited on an MgO substrate oriented in the (001) crystallographic direction, upon its thickness. In particular, FIG. 3 is a graph plotting correlations between anisotropic magnetic field HK and thickness of $Mn_{57}Ga_{43}$, and between saturation magnetization Ms and thickness of $Mn_{57}Ga_{43}$. FIG. 4 is a graph plotting correlations between inherent vertical magnetic anisotropy Ku(int) and thickness of $Mn_{57}Ga_{43}$, and between effective vertical magnetic isotropy Ku(eff) and thickness of $Mn_{57}Ga_{43}$. As shown in FIGS. 3 and 4, decreasing the thickness of the MnGa layer reduces the rates of saturation magnetization, anisotropic magnetic field effective vertical magnetic anisotropy, and inherent vertical magnetic anisotropy. Such deterioration of the magnetic characteristics with decreasing thickness of the MnGa is believed to be caused by lattice distortion of the MnGa at the interface between the Cr buffer layer and the MnGa, as the lattice distortion increases as the thickness of the MnGa film is reduced. Therefore, in order to reduce deterioration of the magnetic characteristics of a thin film of MnGa it may be important to reduce the amount of lattice distortion at the interface of the MnGa film and a material that is stacked adjacent thereto, i.e. to enhance lattice harmonization with each other thereat.

Using a Heussler alloy layer to interface with the MnGa layer may provide a mechanism for reducing such lattice distortion. The material used to form the interface layer that is between the non-magnetic layer and the first or second magnetic layer should not overly impair the magnetic characteristics of the MTJ device. The Heussler alloy may not appreciably reduce the magnetic resistance ratio because of its ferromagnetic property and large spin polarization rate. Additionally, as the Heussler alloy has a lattice constant between the lattice constants of the non-magnetic layer and the first or second magnetic layer, it may reduce lattice inharmonization between the non-magnetic and magnetic layers.

A material suitable for the Heussler alloy employed in the MTJ device is a fully Heussler-ordered alloy having the composition formula $X_2YZ$. In the formula, X and Y denote transition metal elements. X is an element selected from transition elements belonging to groups of Fe, Co, Ni and Cu and from precious metal elements in the periodic table. Y may be one or more kinds of elements selected from transition elements belonging to groups of Ti, V and Mn and from the group of Fe. Z may be an element selected from the III to V groups. Among the Heussler alloys, those having $L2_1$ and B2 structures may have vertical magnetization, thus being suitable for the MTJ devices according to embodiments of the inventive concepts.

For example, X may include Fe, Co, Ni, Cu, or Zn. Y may include Mn or Cr. Z may include Al, Si, Ga, Ge, In, Sn, Tl, Pb, or Sb. For the MTJ device according to certain embodiments of the inventive concepts, a Heussler alloy consisting mainly of Co may be used. As described in more detail herein, in other embodiments the Heussler alloy may comprise $Co_2FeMnSi$, $Co_2FeSi$, $Co_2MnSi$ or other materials that have spin polarization rates of nearly 100%, while also exhibiting low damping constants and lattice constants which are between those of MnGa and MgO, in a direction that is parallel to a film surface.

In case of using MnGa for the first or second magnetic layer and MgO for the non-magnetic layer, the lattice inharmonization may be evaluated by the following equation:

$$(a(MgO)-a(MnGa))/a(MnGa)\times 100$$

Here, the term a(MgO) denotes a lattice constant of MgO in a direction parallel to a film surface thereof and the term a(MnGa) denotes a lattice constant of MnGa in a direction parallel to a film surface thereof.

As discussed above, an MTJ device having the structure of magnetic/non-magnetic/magnetic may exhibit improved characteristics (e.g., increased magnetic resistance ratio) if a crystalline MgO layer is used as the non-magnetic layer. However, since the lattice constant of MnGa in a direction parallel to an interface in a bulk state is 0.389 nm and a lattice constant of MgO in a direction parallel to an interface in a bulk state is 0.421 nm, forming a junction with such MnGa in the $L1_0$ structure and MgO causes lattice inharmonization of about 8%. In order to reduce the amount of lattice distortion, a structure of MnGa/$Co_2FeMnSi$/MgO may be used where the $Co_2FeMnSi$ layer is inserted as a Heussler alloy between the MnGa and MgO layers. As the lattice constant of $Co_2FeMnSi$ in a direction parallel to the film surface in a bulk state is 0.398 nm, the lattice inharmonization with the MnGa is reduced to about 2%. Thus, by interposing an interface layer between the non-magnetic layer and the magnetic layer in the magnetic tunnel junction, it is possible to reduce the amount of lattice distortion and therefore reduce the amount of deterioration in the magnetic characteristics of the MnGa.

In some embodiments, the interface layer may be, for example, about 0.1~8 nm thick. In other embodiments, the interface layer may be about 0.5~5 nm thick. In still other embodiments, the interface layer may be about 1~3 nm thick. Interface layers having these ranges of thicknesses may reduce the degree of lattice inharmonization and may reduce or prevent degradation of the magnetic characteristics of the MTJ device.

Using a Heussler alloy as an interface layer may also reduce diffusion of Mn while forming films to complete the $L2_1$ or B2 structure consisting mainly of X element or while annealing during a subsequent fabrication process. If $Co_2FeMnSi$, which is known as a semi-metal and included in the Heussler alloy having a very large spin polarization rate, is used as an interface layer in an MTJ device, it is able to obtain a very large magnetic resistance ratio. This may improve the readout characteristics of an STT-MRAM device.

Therefore, according to embodiments of the inventive concepts, it is possible to significantly reduce the amount of lattice inharmonization at the interface of the MnGa and MgO films, and restrain the device characteristics from being degraded due to Mn diffusion during subsequent film formation or heat treatment in the fabrication process. As a result, an MTJ device can be fabricated with highly uniform characteristics on a surface of a substrate wafer.

Additionally, while there is no fixed crystalline orientation for the first magnetic layer, the interface layer and the non-magnetic layer, it may be desired to set the first magnetic layer, the interface layer and the non-magnetic layer to be oriented toward the surface of the (100) crystallographic direction in view of lattice harmonization.

<Non-Magnetic Layer>

An MTJ device according to embodiments of the inventive concepts may include a non-magnetic layer between the first and second magnetic layers. The non-magnetic layer acts as a tunnel barrier layer and is formed of an insulating material. The non-magnetic layer may exhibit selective tunnel conductivity and a high magnetic resistance ratio by adopting an appropriate composition with the first or second magnetic layer, or the interface layer which are adjacent thereto.

The non-magnetic layer may be an oxide containing at least one element selected from Mg, Ca, Ba, Al, Be, Sr, Zn, Ti, V, and Nb. For example, in some embodiments the non-magnetic layer may comprise MgO, AlO, ZnO, SrO, or TiO. The non-magnetic layer may also be made of an oxide structured in NaCl crystals. In detail, the non-magnetic layer may include MgO, CaO, SrO, TiO, VO, or NbO. The non-magnetic layer may also include a chloride configured in a NaCl structure such as NaCl, etc.

MTJ devices according to some embodiments of the inventive concepts may use MgO for the non-magnetic layer. As discussed above, using MgO for the tunnel barrier layer results in a large value of spin polarization rate to a specific orientation while also obtaining a very high magnetic resistance ratio. But it will also be appreciated that embodiments of the inventive concepts are not limited to MgO non-magnetic layers. In other words, a non-magnetic layer having a lattice constant close to MgO may alternatively be used to reduce lattice distortion.

Additionally, the non-magnetic layer may be structured in mixed crystals with two or more materials selected from the aforementioned oxides, or in a stack of them. Examples of mixed crystal non-magnetic layers include MgAlO, MgZnO, MgTiO, or MgCaO. An example of double stack structure may be MgO/ZnO, MgO AlO, TiO/AlO, or MgAlO/MgO. An example of triple stack structure may be AlO MgO/AlO, ZnO/MgO/ZnO, or MgAlO/MgO/MgAlO.

A thickness of the non-magnetic layer may be appropriately adjusted based on a tunnel resistance of the material forming the non-magnetic layer. If the non-magnetic layer is made of MgO, its thickness may be between 0.01~3 nm. For example, in some embodiments the thickness may be between 0.5~1 nm. Thicknesses within these ranges may provide stable operation of the tunnel junction.

<Second Magnetic Layer>

An MTJ device according to embodiments of the inventive concepts may include a second magnetic layer that has an easy axis that is vertical to a major surface of the non-magnetic layer. At least one of the first and second magnetic layers is formed of MnGa, and stacked on the non-magnetic layer through the interface layer. In embodiments in which the second magnetic layer is made of MnGa the second magnetic layer may be formed in the same manner and have the same characteristics as the first magnetic layers discussed above that are formed of MnGa. Accordingly, the description thereof will not be repeated here. Hereinafter additional second magnetic layers according to embodiments of the inventive concepts will be described that are formed of a material other than MnGa. If the second magnetic layer is made of MnGa, it is also allowable to use a material, other than MnGa, for the first magnetic layer.

The second magnetic layer may be formed of a ferromagnetic material that can be magnetized vertical to the film surface, and in the MTJ device, may be used for a storage layer or a fixed layer in accordance with a composition state of the first magnetic layer. If the second magnetic layer acts as the fixed layer, a material, which is harder to change its magnetization orientation than the first magnetic layer that acts as the storage layer, may be selected for the second magnetic layer. In other words, the second magnetic layer may formed of a material that has larger values of the effective magnetic anisotropy (Ku(eff)), the saturation magnetization (Ms), and the magnetic damping constant ($\alpha$).

The second magnetic layer may be formed of an $L1_0$-ordered alloy that is a ferromagnetic material characterized in vertical magnetization. This $L1_0$-ordered alloy is sometimes referred to as a CuAu-type ordered alloy. In other words, assuming that an alloy is composed of A and B elements and a face-centered cubic lattice is divided into four simple cubic sub-lattices, the $L1_0$-ordered alloy is said to be formed such that the element A occupies two sub-lattices while the element B occupies the other two sub-lattices. For instance, the $L1_0$-ordered alloy may be an alloy including one or more elements among Fe, Co and Ni, and one or more elements among Pt and Pd. A ferromagnetic material with an easy axis vertical to the film surface, such as an $L1_0$-ordered alloy, may contain FePd, FePt, CoPt, MnAl, FeNiPt, or CoNiPt. It is permissible to adjust effective magnetic anisotropic energy and saturation magnetization by way of adding impurities such as Cu, Cr, Ag, etc., an alloy of them, or an insulation material to such an ordered alloy.

The second magnetic layer may include a disordered alloy that includes Co as a main ingredient and one or more elements among Cr, Ta, Nb, V, W, Hf, Ti, Zr, Pt, Pd, Fe, and Ni. The second magnetic layer may include for example CoCr, CoPt, CoCrTa, CoCrPt, CoCrPtTa, or CoCrNb. These alloys may be adjusted in effective magnetic anisotropic energy and saturation magnetization by increasing the percentage of non-magnetic elements included therein.

The second magnetic layer may include an alloy in which one magnetic element selected from a group of Mn, Fe, Co and Ni, is combined with two non-magnetic elements selected from a group of Al, Ga, In, Si, Ge, Sn, As, Sb and Bi. For example, the second magnetic layer may include MnAlGe, MnGaGe, or MnZnSb.

The second magnetic layer may include an alloy that contains elements of ones selected respectively from transition metals (e.g. Fe, Co, and Ni) and rare earth metals (e.g., Tb, Dy, and Gd). For example, the second magnetic layer may include TbFe, TbCo, TbFeCo, DyTbFeCo, or GdTbCo. The second magnetic layer may include a multilayer structure in which those alloys are alternately stacked. For example, the second magnetic layer may include a multilayer such as TbFe/Co, TbCo/Fe, TbFeCo/CoFe, DyFe/Co, DyCo/Fe, or DyFeCo/CoFe. These alloys may be controlled in magnetic anisotropic energy and saturation magnetization by adjusting their film thickness ratio or composition ratio.

The second magnetic layer may include an artificial lattice having an alternately stacked structure with an alloy which contains at least one of Fe, Co, and Ni, and an alloy which contains at least one of Cr, Pt, Pd, Ir, Rh, Ru, Os, Re, Au, and Cu. For instance, the second magnetic layer may include Co/Pt, Co/Pd, CoCr/Pt, Co/Ru, Co/Os, Co/Au, or Ni/Cu. This artificial lattice may be controlled in effective magnetic anisotropic energy and saturation magnetization by adjusting an amount of a non-magnetic element that is included in the magnetic layer, a thickness ratio between the magnetic layer and the non-magnetic layer, and/or a stacking period.

The thickness of the second magnetic layer, except the MnGa layer, may be variable depending on whether the second magnetic layer acts as the fixed layer or the storage layer. In some embodiments, the thickness may be between 1~30 nm. In other embodiments, the thickness may be between 5~10 nm. When acting as a fixed layer, the second magnetic layer may have a relatively larger thickness, such as 5~25 nm, or 6~10 nm. When acting as a storage layer, the second magnetic layer may have a relatively smaller thickness, such as 1~15 nm, or 2~7 nm.

<Fabrication Process>

Fabricating an MTJ device according to embodiments of the inventive concepts may not be restrictive to any specification, but even a known method is available thereto. It may be generally allowable to utilize a process of physical vapor deposition such as sputtering, molecular beam epitaxial growth, atomic layer deposition, pulse laser deposition, ionic beam deposition, cluster ion beam, or ionic plating, or a process of chemical vapor deposition. There are various types of the sputtering method, such as RF sputtering, DC sputtering, electronic cyclotron resonance sputtering, helicon sputtering, inductive-coupling plasma sputtering, etc.

In forming the layers of MgO, MnGa, and so on, the sputtering method uses a target that is composed of an oxide or alloy with a composition corresponding to compositions necessary respectively to the non-magnetic layer and the first or second magnetic layer. Additionally, the MgO and MnGa layers may be formed by means of a reactive sputtering method. Alternatively, the material may be oxidized after depositing the material on the substrate using various oxidation techniques such as natural oxidation, plasma oxidation, radical oxidation, ozone oxidation, and so on.

<Embodiment>

Hereinafter will be described an experimental embodiment of the inventive concepts but the inventive concepts are not restricted thereto.

In this embodiment, an MTJ device was fabricated in a structure of MnGa/Co$_2$FeMnSi/MgO. A magnesium oxide (MgO) substrate whose surface is oriented toward the (001) crystallographic direction was prepared. The substrate was cleaned by heating the substrate via ramp-annealing for an hour at 800° C. in a high vacuum atmosphere of about $10^{-7}$ Pa.

On the MgO (001) substrate whose surface had been cleaned, magnetron sputtering was used to form a 40 nm thick Cr buffer layer in an Ar gas atmosphere at a pressure of 0.125 Pa, with a sputter output of 42 W and substrate temperature lower than 200° C. Thereafter, the sample was heated via ramp annealing for one hour at a temperature of 700° C. under high vacuum atmosphere to provide a Cr buffer layer with enhanced crystallographic orientation.

Thereafter, magnetron sputtering was used to form a 10 nm thick MnGa layer, as a vertical magnetization layer, on the Cr buffer layer in an Ar gas atmosphere at a pressure of 0.1 Pa, with a sputter output of 40 W and a substrate temperature lower than 200° C. Next, ramp annealing was performed to heat up the sample for 10 minutes at a temperature of 400~500° C. in a high vacuum atmosphere, thus enhancing crystallographic orientation of the $L1_0$ structure. An MnGa target composed of $Mn_{0.5}Ga_{0.5}$ was used during the magnetron sputtering and the grown MnGa had a composition of about $Mn_{0.57}Ga_{0.43}$, resulting in improved vertical magnetic characteristics.

Thereafter, magnetron sputtering was performed with Co$_2$FeSi and Co$_2$MnSi targets to form a 2 nm thick Co$_2$FeMnSi layer, as the interface layer, on the MnGa vertical magnetization layer. The sputtering conditions were set, for the Co$_2$FeSi target, in Ar gaseous pressure of 0.1 Pa and a sputter output of 15 W, and for the Co$_2$MnSi target, in Ar gaseous pressure of 0.1 Pa and a sputter output 22 W, and under substrate temperature lower than 200° C. Under these processing conditions, the Co$_2$FeMnSi layer was formed with a composition of Co$_2$Fe$_{0.4}$Mn$_{0.6}$Si. Additionally, by heating up the sample via ramp annealing for 10 minutes at a temperature of 300° C. in a high vacuum atmosphere, the crystallographic orientation of the $L1_0$ or B2 structure was improved.

Afterwards, electron beam deposition was performed to form a 1 nm thick MgO layer, as the tunnel barrier layer, on the interface layer of Co$_2$FeMnSi with a growth rate about 0.005 nm/s.

Next, the same processing methods were used to form a Co$_2$FeMnSi interface layer and an MnGa vertical magnetization layer, and then finally the magnetron sputtering was used to form a Ta capping layer to complete the MTJ device.

As described above, owing to formation of an interface layer, which has a lattice constant that is between the lattice constants of a ferromagnetic layer and a non-magnetic layer, a magnetic tunnel junction (MTJ) device is capable of diminishing the MnGa lattice inharmonization of the ferromagnetic layer and lessening degradation of the magnetic characteristics.

While the inventive concepts have been described with reference to exemplary embodiments, it will be apparent to those skilled in the art that various changes and modifications may be made without departing from the spirit and scope thereof. Therefore, it should be understood that the above embodiments are not limiting, but illustrative.

What is claimed is:

1. A magnetic tunnel junction device comprising:
   a first magnetic layer that has an easy axis that is vertical to a major surface of the first magnetic layer;
   a non-magnetic layer on the first magnetic layer;
   a second magnetic layer that has an easy axis that is vertical to a major surface of the second magnetic layer on the non-magnetic layer; and an interface layer formed of a Heussler alloy between the non-magnetic layer and at least one of the first and second magnetic layers, wherein the at least one of the first and second magnetic layers is formed of MnGa, wherein a lattice constant of the interface layer parallel to a major surface of the interface layer in a bulk state thereof is between a lattice constant of the non-magnetic layer parallel to a major surface of the non-magnetic layer in a bulk state thereof and a lattice constant of the at least one of the first and second magnetic layers parallel to a major surface thereof in a bulk state thereof, wherein a current flowing through the first magnetic layer, the non-magnetic layer, the second magnetic layer, and the interface layer changes magnetization orientations of the interface layer and one of the first and second magnetic layers, wherein the at least one of the first and second magnetic layers has a thickness of 1~30 nm and the interface layer has a thickness of 0.1~8 nm.

2. The magnetic tunnel junction device of claim 1, wherein the Heussler alloy has a composition formula $X_2YZ$ where X is a transition metal element from the group of Fe, Co, Ni and Cu or a precious metal element, Y is one or more elements selected from the transition metal elements from the groups Ti, V and Mn, and Z is an element selected from Groups III, IV or V of the periodic table.

3. The magnetic tunnel junction device according to claim 2, wherein the Heussler alloy comprises at least one of $Co_2FeMnSi$, $Co_2FeSi$, and $Co_2MnSi$.

4. The magnetic tunnel junction device according to claim 3, wherein the non-magnetic layer comprises MgO.

5. The magnetic tunnel junction device of claim 4, wherein the first magnetic layer is an MnGa layer that has a composition ratio of $Mn_xGa_{100-x}$ where $43 \leq x \leq 75$.

6. The magnetic tunnel junction device of claim 1, wherein the first magnetic layer consists of MnGa having a $D0_{22}$ structure and a composition ratio of $Mn_xGa_{100-x}$ where $67 \leq x \leq 75$.

7. The magnetic tunnel junction device of claim 1, wherein the first magnetic layer comprises a MnGa layer, the non-magnetic layer comprises an MgO layer, and an inharmonization between the lattice constant of the first magnetic layer and the lattice constant of the interface layer is within about 2%.

8. The magnetic tunnel junction device of claim 1, further comprising a buffer layer that includes Cr that directly contacts the first magnetic layer.

9. A magnetic tunnel junction device comprising:
a first MnGa magnetic layer that has an easy axis that is vertical to a major surface of the first MnGa magnetic layer;
a non-magnetic layer on the first MnGa magnetic layer;
a second magnetic layer that has an easy axis that is vertical to a major surface of the second magnetic layer on the non-magnetic layer; and
an interface layer formed of a Heussler alloy between the first MnGa magnetic layer and the non-magnetic layer, the interface layer having a lattice constant parallel to a major surface of the interface layer in a bulk state thereof that is between a lattice constant of the non-magnetic layer parallel to a major surface of the non-magnetic layer in a bulk state thereof and a lattice constant of the first MnGa magnetic layer parallel to the major surface of the first MnGa magnetic layer in a bulk state thereof,
wherein the first MnGa magnetic layer, the non-magnetic layer, the second magnetic layer, and the interface layer are configured so that a current flowing through the first MnGa magnetic layer, the non-magnetic layer, the second magnetic layer, and the interface layer changes magnetization orientations of the interface layer and at least one of the first MnGa magnetic layer and the second magnetic layer,
wherein the Heussler alloy has a composition formula $X_2YZ$ where X is a transition metal element from the group of Fe, Co, Ni and Cu or a precious metal element, Y is one or more elements selected from the transition metal elements from the groups Ti, V and Mn, and Z is an element selected from Groups III, IV or V of the periodic table.

10. The magnetic tunnel junction device of claim 9, wherein the second magnetic layer comprises a second MnGa magnetic layer and the interface layer comprises a first interface layer, the magnetic tunnel junction device further comprising a second interface layer formed of a Heussler alloy between the second MnGa magnetic layer and the non-magnetic layer, the second interface layer having a lattice constant parallel to a major surface of the second interface layer in a bulk state thereof that is between a lattice constant of the non-magnetic layer parallel to a major surface of the non-magnetic layer in a bulk state thereof and a lattice constant of the second MnQa magnetic layer parallel to the major surface of the second MnGa magnetic layer in a bulk state thereof.

11. The magnetic tunnel junction device of claim 10, wherein the Heussler alloy comprises at least one of $Co_2FeMnSi$, $Co_2FeSi$, and $Co_2MnSi$.

12. The magnetic tunnel junction device of claim 11, wherein the first MnGa magnetic layer has a composition ratio of $Mn_xGa_{100-x}$ where $43 \leq x \leq 75$.

13. The magnetic tunnel junction device of claim 12, wherein the first MnGa magnetic layer has a thickness between 1 nm and 30 nm and the first interface layer has a thickness between 0.1 nm and 8 nm.

14. The magnetic tunnel junction device of claim 9, wherein the interface layer has a thickness between 1 nm and 3 nm.

15. The magnetic tunnel junction device of claim 9, wherein the non-magnetic layer comprises an MgO layer, and the inharmonization between the lattice constant of the first magnetic layer and the lattice constant of the interface layer is within about 2%.

16. A magnetic tunnel junction device comprising:
a first MnGa magnetic layer that has an easy axis that is vertical to a major surface of the first MnGa magnetic layer;
a non-magnetic layer comprising MgO on the first MnGa magnetic layer;
a second MnGa magnetic layer that has an easy axis that is vertical to a major surface of the second magnetic layer on the non-magnetic layer opposite the first MnGa magnetic layer; and
a first interface layer that includes a first Heussler alloy between the first MnGa magnetic layer and the non-magnetic layer, the first interface layer having a lattice constant parallel to a major surface of the first interface layer in a bulk state thereof that is between a lattice constant of the non-magnetic layer parallel to a major surface of the non-magnetic layer in a bulk state thereof and a lattice constant of the first MnGa magnetic layer parallel to the major surface of the first MnGa magnetic layer in a bulk state thereof,
a second interface layer formed of a second Heussler alloy between the second MnGa magnetic layer and the non-magnetic layer, the second interface layer having a lattice constant parallel to a major surface of the second interface layer in a bulk state thereof that is between a lattice constant of the non-magnetic layer parallel to a major surface of the non-magnetic layer in a bulk state thereof and a lattice constant of the second MnGa magnetic layer parallel to the major surface of the second MnGa magnetic layer in a bulk state thereof, wherein one of the first and second Heussler alloys has a composition formula $X_2YZ$ where X is a transition metal element from the group of Fe, Co, Ni and Cu or a precious metal element, Y is one or more elements selected from the transition metal elements from the groups Ti, V and Mn, and Z is an element selected from Groups III, IV or V of the periodic table, and the other of the first and second Heussler alloys comprises $Co_2FeMnSi$, wherein the first MnGa magnetic layer has a thickness between 1 nm and 30 nm and the first interface layer has a thickness between 0.1 nm and 8 nm, and wherein the first MnGa magnetic layer has a composition ratio of $Mn_xGa_{100-x}$ where $43 \leq x \leq 75$.

17. The magnetic tunnel junction device of claim 16, wherein the non-magnetic layer comprising MgO comprises a combination of MgO and at least one other element in a single layer or a multi-layer non-magnetic layer that includes at least one layer of MgO.

18. The magnetic tunnel junction device of claim 16, wherein the first MnGa magnetic layer consists of MnGa having a $D0_{22}$ structure.

19. The magnetic tunnel junction device of claim 16, wherein an inharmonization between the lattice constant of the first magnetic layer and the lattice constant of the interface layer is within about 2%.

20. The magnetic tunnel junction device of claim 16, further comprising a buffer layer that includes Cr that directly contacts the first MnGa magnetic layer.

\* \* \* \* \*